(12) United States Patent
Robbins (10) Patent No.: US 8,004,579 B2
(45) Date of Patent: Aug. 23, 2011

(54) GAIN MEASUREMENT STRUCTURE

(75) Inventor: Mark Stanford Robbins, Essex (GB)

(73) Assignee: E2V Technologies (UK) Limited, Chelmsford (GB)

( * ) Notice: Subject to any disclaimer, the term of this patent is extended or adjusted under 35 U.S.C. 154(b) by 893 days.

(21) Appl. No.: 11/585,342

(22) Filed: Oct. 24, 2006

(65) Prior Publication Data

US 2007/0146521 A1    Jun. 28, 2007

(30) Foreign Application Priority Data

Oct. 24, 2005 (GB) .................................. 0521651.0

(51) Int. Cl.
*H04N 5/235* (2006.01)
*H04N 5/335* (2011.01)

(52) U.S. Cl. ............... 348/229.1; 348/230.1; 348/294; 348/311; 348/312; 348/315; 348/316; 348/297; 348/298

(58) Field of Classification Search ............... 348/229.1, 348/230.1, 294, 311, 312, 315, 316, 297, 348/298
See application file for complete search history.

(56) References Cited

U.S. PATENT DOCUMENTS

| 4,585,934 | A |  | 4/1986 | French et al. |  |
|---|---|---|---|---|---|
| 5,337,340 | A | * | 8/1994 | Hynecek | 377/60 |
| 6,444,968 | B1 | * | 9/2002 | Burt et al. | 250/208.1 |
| 7,291,821 | B2 | * | 11/2007 | Robbins | 250/208.1 |
| 2002/0093288 | A1 | * | 7/2002 | Spencer et al. | 313/523 |
| 2003/0035057 | A1 |  | 2/2003 | Hakamata et al. |  |
| 2004/0150737 | A1 | * | 8/2004 | Pool et al. | 348/311 |
| 2006/0163474 | A1 | * | 7/2006 | Denvir | 250/305 |
| 2007/0200052 | A1 |  | 8/2007 | Seyfried et al. |  |

FOREIGN PATENT DOCUMENTS

| EP | 1 688 960 |  | 8/2006 |
| GB | 2371403 | A | 7/2002 |
| JP | 2003009000 | A * | 1/2003 |

OTHER PUBLICATIONS

Jaroslav Hynecek, "Impactron—A New Solid State Image Intensifier", IEEE Transactions on Electron Devices, IEEE Service Center, Pisacataway, NJ, US, vol. 48, No. 10, Oct. 2001, XP011017812 ISSN: 0018-9383.
Robbins, Mark Stanford, et al., "The Noise Performance of Electron Multiplying Charge-Coupled Devices," *IEEE Transactions on Electron Devices*, vol. 50, No. 5, May 2003.
EPO Search Report, dated Apr. 24, 2008, issued in connection with counterpart EP Application No. 07250602.5.
UK Patent Office Search Report, dated Jun. 27, 2006, issued in connection with counterpart British Application No. GB0602965.6.
UK Search Report dated Jan. 7, 2008, issued in connection with counterpart GB Application No. GB0717484.0.
Written Opinion issued Dec. 1, 2009, in corresponding Netherlands Appl. NL1032725 (with partial English language translation).

* cited by examiner

*Primary Examiner* — Nhan T Tran
*Assistant Examiner* — Quang V Le
(74) *Attorney, Agent, or Firm* — Venable LLP; Robert Kinberg; Christopher Ma (57) ABSTRACT

A CCD Device of the type for providing charge gain by impact ionisation has a multiplication register. Gain provided by a subset of the elements of the multiplication register are independently controllable from other elements in the register. This enables the register to be used in one setting with the same gain applied to all elements and a different setting with a subset of elements arranged to provide a different gain. By comparing the two signals, the gain provided by each element and the register as a whole may be derived.

21 Claims, 6 Drawing Sheets

GAIN MEASUREMENT STRUCTURE

CROSS-REFERENCE TO RELATED APPLICATION

This application claims the priority of GB 0521651.0, filed Oct. 24, 2005, the disclosure of which is incorporated herein by reference.

FIELD OF THE INVENTION

The present invention relates to a CCD device, and in particular to a CCD which provides gain within the charge domain.

BACKGROUND OF THE INVENTION

In a typical CCD imager, signal charge representative of incident radiation is accumulated in an array of pixels in an image area. Following an integration period, signal charge is transferred to a store section and then to an output register by applying appropriate clocking or drive pulses to control electrodes. The signal charge is then read out from the output register and applied to a charge detection circuit to produce a voltage that is representative of the amount of signal charge. The sensitivity of such a device is limited by the noise of the charge to voltage conversion process and that introduced by the subsequent video chain electronics.

Figure 1:
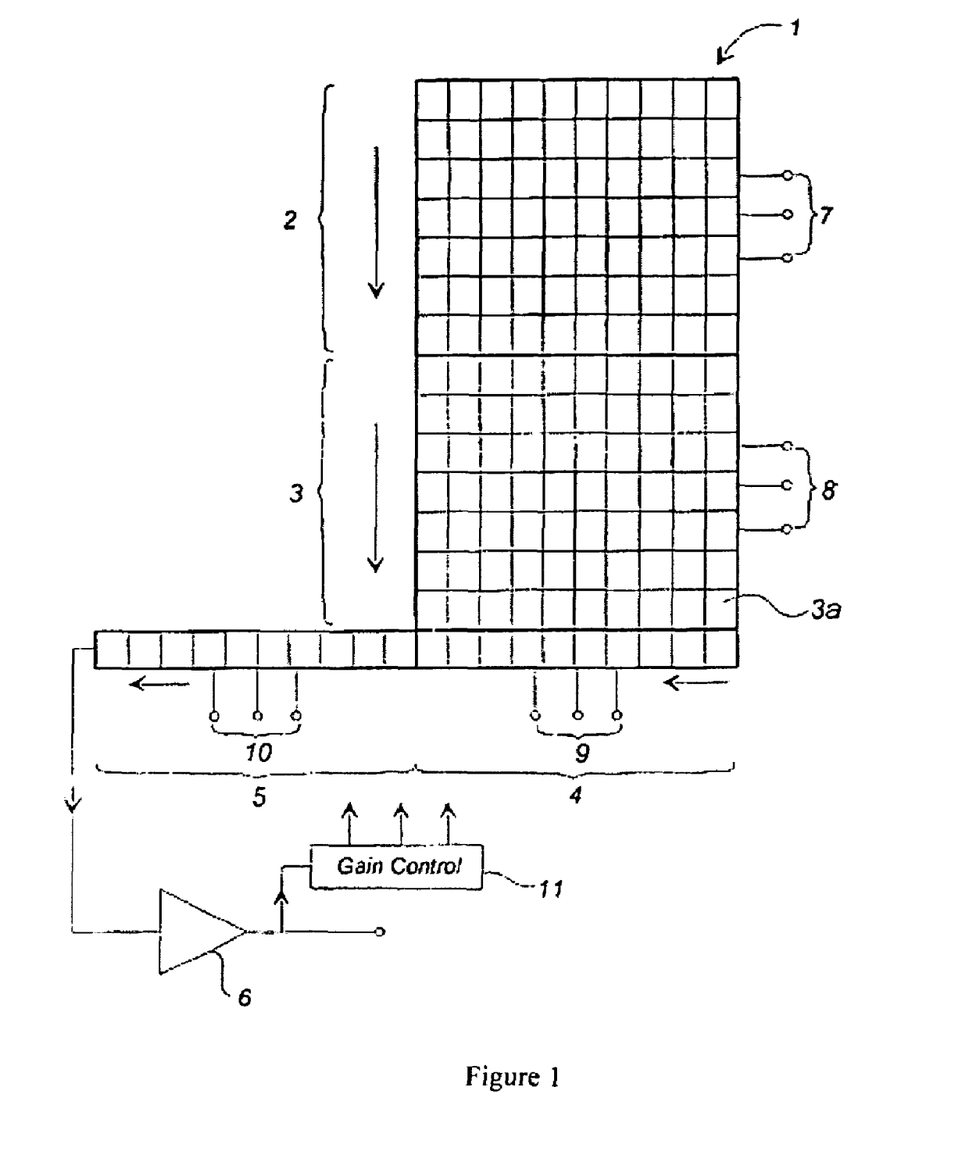
FIG. 1 is a schematic diagram of a CCD imager of known type and which may embody the invention.

An electron multiplying CCD overcomes this limitation and is disclosed in our earlier published UK patent application GB-A-2,371,403, as shown in FIG. 1. A CCD imager 1 comprises an image area 2, a store section 3 and an output or read-out register 4, each of these components being found in a conventional CCD imager. The output register 4 is extended serially to give a multiplication register 5, the output of which is connected to a charge detection circuit 6.

During operation of the device, incident radiation is converted at the image area 2 into signal charge which is representative of the intensity of the radiation impinging on the array of pixels making up the image array. Following the image acquisition period, drive pulses are applied to control electrodes 7 to transfer the charge accumulated at the pixels of the image area 2 to the store section 3. Simultaneously with this, drive signals are also applied to control electrodes 8 at the store section 3 to cause charge to be transferred from row to row as indicated by the arrow, the last row of charge held in elements in row 3 being transferred in parallel to the output register 4.

When a row of signal charge has been transferred into the output register 4, appropriate drive pulses are applied to the electrodes 9 to sequentially transfer the charge from the elements of the output register to those of the multiplication register 5. In this embodiment, the multiplication register is of similar architecture to the output register in so far as doping is concerned with the addition of an electrode for multiplication.

To achieve multiplication of charge in each of the elements of the multiplication register 5, sufficiently high amplitude drive pulses are applied to control electrodes 10 to both transfer signal charge from one element to the next adjacent element in the direction shown by the arrow and also to increase the level of signal charge due to impact ionisation by an amount determined by the amplitude of the drive pulses. Thus, as each packet of charge is transferred from one element to the next through the multiplication register, the signal charge increases. The charge detected at circuit 6 is thus a multiplied version of the signal charge collected in the output register 4. At each stage of the multiplication register, the signal charge is increased. Each signal charge packet stored in the output register 4 undergoes an identical multiplication process as each travels through all the elements of the multiplication register 5.

The output of the charge detection circuit 6 is also applied to an automatic gain control circuit 11 that adjusts the voltages applied to the multiplication register 5 to control the gain. In other embodiments, this feedback arrangement is omitted. Gain may then be controlled manually if desired.

Whilst the gain control circuit can vary the gain provided by varying the voltages applied to the multiplication register, we have appreciated the need to determine the actual level of gain provided by such a CCD charge multiplication arrangement. One way to measure the gain is to inject a known amount of signal into the multiplication register and monitor the output. The difficulty with this approach is knowing what the input signal is. Typically this signal will be below the noise floor of the video chain if multiplication gain is not applied. Therefore measuring the signal with and without gain is not a practical proposition.

The approach usually taken to measure the gain is to illuminate the device and to measure the output with no multiplication gain. The light level is then reduced by a known fraction (by reducing the aperture of the optics or using neutral density filters for example). The reduction of light level will be of the same order as the gain to be measured. Multiplication gain is then applied and the output signal is measured. The multiplication gain can be calculated knowing the output signal and the reduction in light level. This method can give accurate results but is cumbersome and not particularly suitable for automatic measurements within a camera system.

We have appreciated an improved arrangement and method for measuring gain is required.

SUMMARY OF INVENTION

The invention is defined in the claims to which reference is now directed. The invention provides a CCD device in which a plurality of multiplication elements provides charge multiplication. The gain of each element, or groups of elements, can be separately controlled so that a measurement of gain can be made. The embodiments of the invention relate to this separate control and the method of measuring gain.

The preferred embodiment of the invention is a CCD imager, which has an additional register for charge multiplication. Within the additional register (the multiplication register) each element (multiplication element) has a sequence of electrodes, between which voltages are applied, in use, so as to clock charge through the element and apply gain. At least one of the electrodes is a high voltage electrode which has a voltage applied high enough in comparison to a preceding DC electrode so that the fields experienced by signal electrons cause impact ionisation. The magnitude of the charge multiplication is dependent on the potential difference between the high voltage electrode and the preceding DC electrode. It is within the multiplication register that the independent control of gain in each element is provided.

The preferred arrangement for controlling gain of the multiplication elements is to provide two groups of elements. These groups can be arranged with one group of elements after another, or with elements in the groups interleaved with one another. The gain of one group may be set substantially to unity gain (that is no gain is provided by those elements) for a period of time. The gain provided by each element, and the multiplication register as a whole can then be determined based on the ratio of the signals with and without gain applied to one of the groups of elements.

As well as providing gain measurement, the arrangement and method may also be used for gain control.

DESCRIPTION OF THE FIGURES

An embodiment of the invention will now be described by way of example and with reference to the accompanying figures in which.

DESCRIPTION OF A PREFERRED EMBODIMENT

The present embodiment comprises a CCD device such as a CCD imager of known type but modified to allow independent control of the gain provided by multiplication elements in a multiplication register. The independent control could be of each element, but it is preferred that the elements are arranged in two or more groups, the gain of each group of elements being independently controllable. A known device is shown and has been described in relation to FIG. 1. The invention may be embodied in such a device, and in an imager or camera including such a device. The arrangement of a multiplication register and elements within that register to which the invention may be applied will first be described with reference to FIGS. 1 to 3.

As shown in FIG. 1, an image area 2 accumulates charge in CCD elements and transfers charge under control of clocked drive pulses on electrodes 7, 8 to a store area 3 and from the store area to an output register 4 and subsequently to a multiplication register 5. It is in the multiplication register that the invention is embodied, though it will be appreciated that other arrangements of multiplication elements could be used. Although shown as a straight-line extension of the output register 4, in reality it will probably be bent around the imager for packaging reasons.

Figure 2:
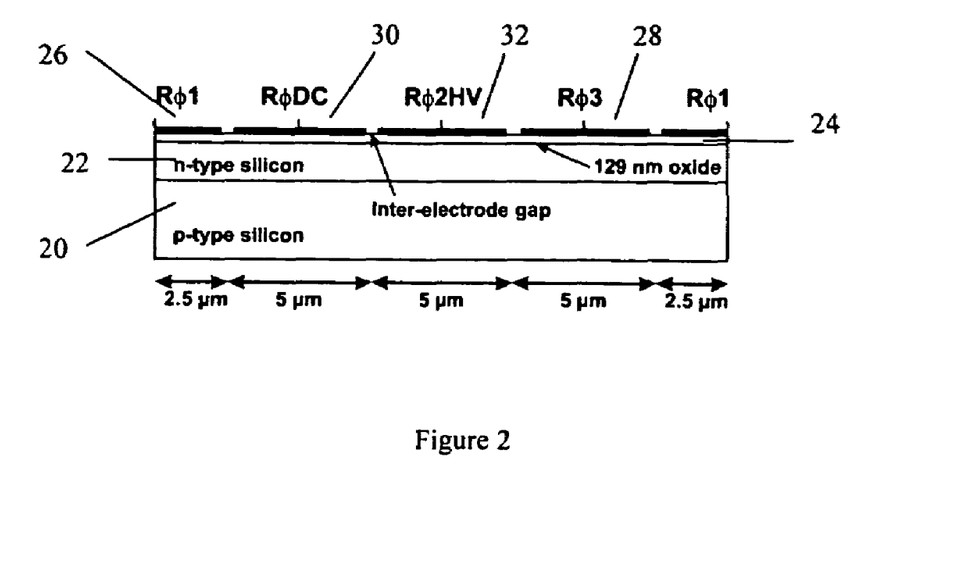
FIG. 2 is a schematic diagram of a physical cross section of one element in a multiplication register.

A multiplication element of known type is shown in FIG. 2. The element comprises a base 20 of p-type silicon, an n-type layer 22 and a gate dielectric layer 24 which may, as an example, comprise a layer of Si3N4 over SiO2 or SiO2 only. On the gate dielectric layer, each element has four electrodes shown as normal clocked electrodes $\phi 1$ 26 and $\phi 3$ 28, a DC electrode $\phi DC$ 30 and a high voltage electrode $\phi 2HV$ 32. The element provides gain by clocking voltages at the electrodes such that a relatively high voltage at electrode $\phi HV$ 32 causes impact ionisation of charge. The naming convention of the electrodes in the format "R$\phi 1$" as shown in the diagrams is well known and will be referred to herein as "$\phi 1$" for brevity. Similarly, the high voltage electrode "$\phi 2HV$" may be referred to as "$\phi 2$" for brevity.

Figure 3:
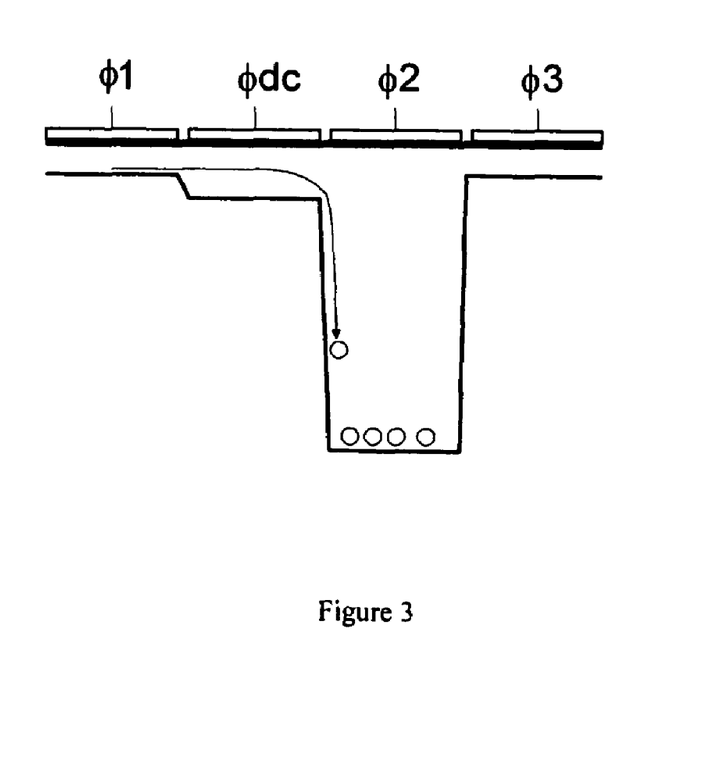
FIG. 3 is a schematic cross section of a single multiplication element showing voltages applied to electrodes at a point in time.

A schematic cross section of a single multiplication element is given in FIG. 3. The multiplication element of the multiplication register is made up of four phases although other configurations could be possible. $\phi 1$ and $\phi 3$ are clocked as normal readout register phases. $\phi DC$ is a DC phase that separates $\phi 1$ from $\phi 2$. The high voltage electrode $\phi 2$, the multiplication phase, is a clocked phase but using a much greater amplitude than $\phi 1$ and $\phi 3$. On the high to low transition of $\phi 1$ (the potential increasing in the direction of the arrow in FIG. 3), the signal originally under $\phi 1$ will drift to $\phi 2$. The potential on $\phi 2$ is set high enough so that the fields experienced by the electron signal will cause impact ionisation to take place. Once the signal electrons and the electrons created by the impact ionisation are collected under $\phi 2$ the total amplified signal can then be transferred to $\phi$ by switching $\phi 2$ low and $\phi$ high. The process is repeated through all the gain (multiplication) elements in the multiplication register. As an example, the device could have 591 gain elements. If the impact ionisation increases the signal by 1% at each element, the combined gain of the multiplication register of the CCD will be $1.01^{591}=358$.

As shown, charge is increased in each (multiplication) element by application of voltage at $\phi 2$ (HV) which causes electrons to form from the impact ionisation process. It is noted, for the avoidance of doubt, that the voltages shown are clocked and so vary in amplitude. The voltages are shown at a given instant.

Figure 4:
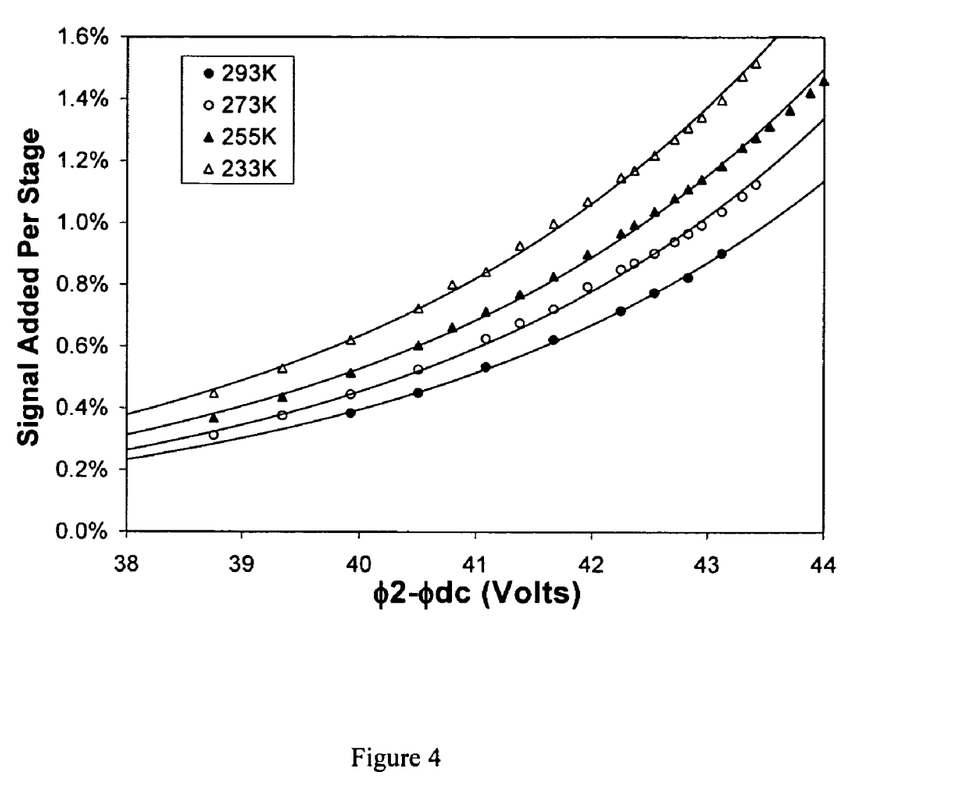
FIG. 4 is a chart showing the relationship between voltage difference between electrodes of an elements and the signal added.

The gain of each multiplication element is dependent on the potential applied between the high voltage electrode ($\phi 2$) and the preceding DC phase ($\phi dc$) as shown in FIG. 4.

Any number of these elements can be employed in sequence so that when charge leaves one element it enters the next. Usually the fraction of signal added for each multiplication element is the same (ignoring statistical variations). In this case the total multiplication gain then applied to the signal is thus $$G=(1+\alpha)^N \qquad \text{Equation (1)}$$

where $\alpha$ is the fraction of signal added per stage and N is the number of stages. Typically N will be between 400 and 600. For an N of 600 and an $\alpha$ of 1.2% the total gain is 1283.

Ideally the gain from the sensor could be estimated by knowing the characteristics of the sensor (such as shown in FIG. 4). Knowing the clock amplitudes and DC biases the gain can then be calculated. However, the gain characteristics vary with temperature and they can change with operational time. Also they do vary from device to device. Therefore the gain characteristics cannot be sensibly assumed and if the value of gain is required it will have to be measured.

The method of the present embodiment enables a convenient measurement of gain that can be easily implemented within a system. Usually the multiplication gain per stage is constant for all multiplication elements and common electrical connections are made between stages. In the embodiment of the present invention the gain of each element, or groups of elements can be separately controlled by separate connections.

Figure 5:
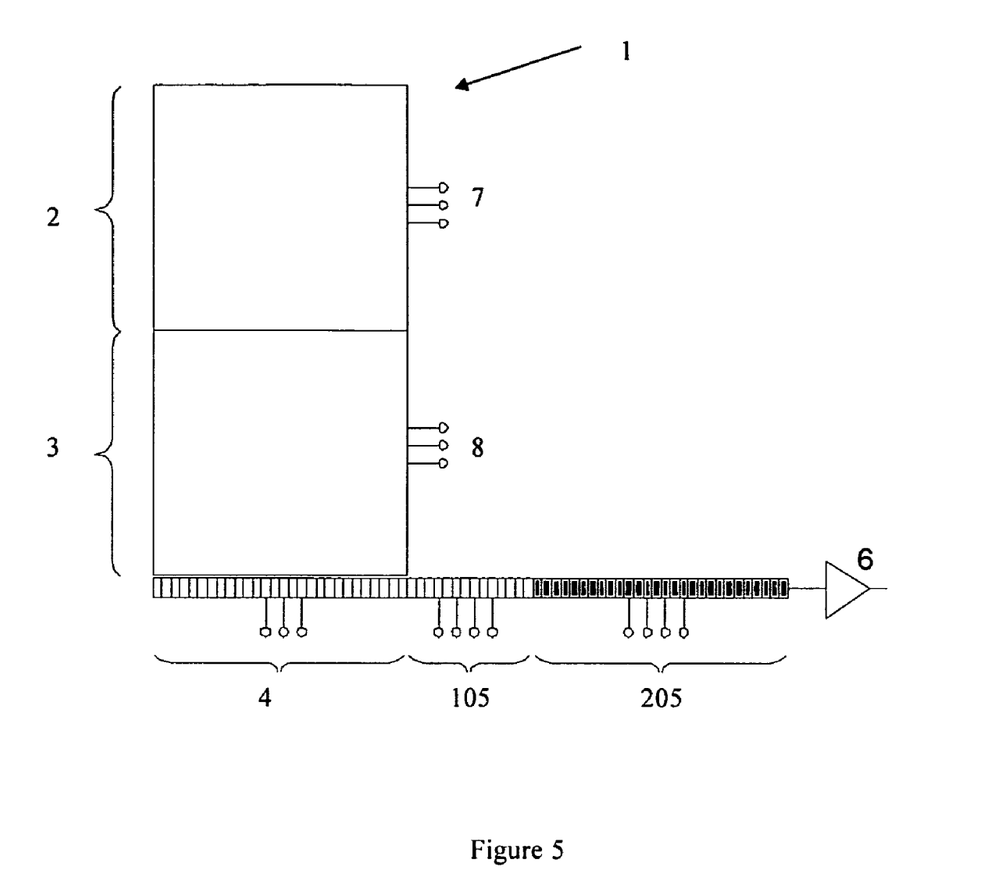
FIG. 5 is a schematic representation of a frame transfer device embodying the invention.

A schematic representation of a frame transfer device showing two groups of multiplication elements is shown in FIG. 5. The numbering of similar features is the same as for FIG. 1. In this implementation the device 1 consists of an image section 2, storage section 3, a readout register 4 and a multiplication register 5 logically divided into two sequential multiplication registers 105, 205, and a charge to voltage conversion amplifier 6.

In this example two sequential groups of multiplication elements are used. The gain of each group can be separately controlled. Let the number of elements in group 1 be N1 and the number of elements in group 2 be N2. The fraction of signal added per stage in group 1 is $\alpha 1$ and the fraction of signal added per stage in group 2 is α2. Although FIG. 5 shows two sequential groups this concept and the following calculations can be applied to groups of multiplication elements that are interleaved.

In normal operation the clock amplitudes, dc levels and clock timings are set so that α1=α2=α and the total number of multiplication elements, N=N1+N2. The total gain is given by equation (1). In order to measure this gain, G, the device is illuminated so that the input signal to the multiplication register is Sin, and the output signal, S1, is then measured. The signal added per stage of one of the groups, say group 1, is then reduced (i.e. α1 is reduced). This can be achieved, for example, by increasing the φdc level, reducing the φ2 amplitude or by changing the phasing of the φ2 clock. The output signal will be reduced and this new level S2, is noted.

$$S_1 = s_{in} G = s_{in}(1+\alpha)^N$$

$$S_2 = s_{in}(1+\alpha_2)^{N_2}(1+\alpha_1)^{N_1}$$

Assuming the gain per stage of group 2 is not altered (i.e. α2=α) and noting that N2=N−N1 we have $$S_2 = s_{in}(1+\alpha)^{N-N_1}(1+\alpha_1)^{N_1}$$

the fractional drop in signal is thus given by $$\frac{S_2}{S_1} = \left(\frac{1+\alpha_1}{1+\alpha}\right)^{N_1}$$

Figure 6:
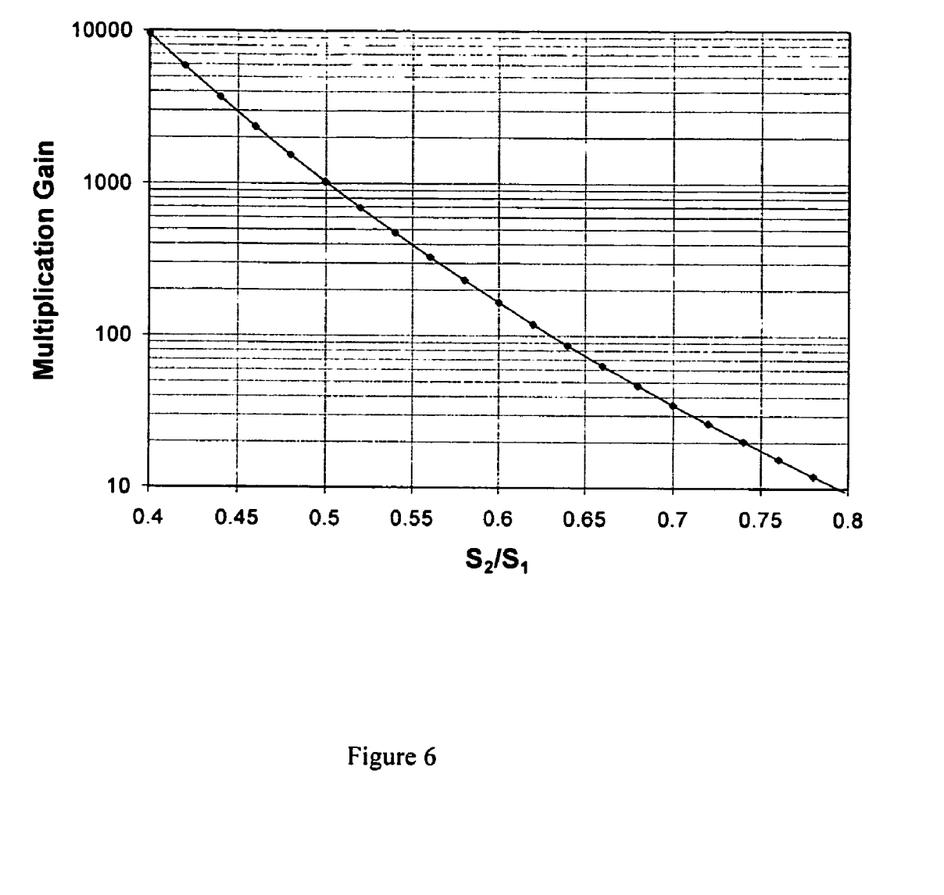
FIG. 6 shows the gain as a function of the ratio of two signals.

If the signal added per stage from the first group is reduced to zero we have $$\frac{S_2}{S_1} = \left(\frac{1}{1+\alpha}\right)^{N_1} = G^{-N_1/N}$$

thus knowing the fractional drop the in signal the gain can be calculated easily. By choosing an appropriate value for $N_1$ when designing the device good gain measurements can be achieved without having to measure very small signals. For example, a device could have a total of 600 multiplication elements, split into two groups, one of which has 60 elements, the other having 540 elements. If on reducing the gain per stage of the 60 element group to unity (no gain provided), the output signal reduces by a factor two, the total gain, G, is calculated to be 1024. The gain as a function of $S_2/S_1$ for such a device is shown in FIG. 6.

The device architecture and measurement method described enables the easy measurement of multiplication gain. The technique is ideally suited to the automatic implementation of gain measurement within a camera system. It should be noted that, although this example describes a frame transfer architecture, any CCD architecture can be employed, for example full frame or inter line architecture or alternatively a linear device can make use of this invention. In fact, any device utilising the multiplication register concept can benefit from this invention.

The embodiment described implements the independent control of groups of elements in a multiplication register by providing a multiplication register divided into two separate registers, one sequentially arranged after the other. Groups of elements could equally be arranged within a single multiplication register by interleaving elements of one group with elements of another. For example, every tenth element could belong to a first group and the remainder to another. This arrangement has the benefit of minimising any discrepancy of gain due to any temperature gradient on the register. More than two groups could be provided with independent control of gain. In the extreme, every single element could be independently controllable, though this would add to the complexity of connections required to provide voltages to the elements.

To provide appropriate connections to control the groups of elements, the connections to the φ2—(high voltage) for one group could be connected together and the connections to the φ2 (high voltage) for another group connected together. This allows the gain provided by each group to be varied by independently varying the φ2 phase or voltage applied to each group. Similarly, the connections to φDC may be grouped together so that the voltage on φDC may be independently varied for each group. Either way, the voltage difference between φ2 and φDC may be reduced selectively for each group thereby reducing the gain provided by elements of that group to unity.

Normally, for a device without gain measurement all the φ1 electrodes are connected together, all the DC electrodes will be connected, all the φHV electrodes are connected and all the φ3 electrodes are connected together. This is for convenience. In the embodiment of the invention the connections are separated into two groups. However, for convenience one would like to connect up as many of the electrodes as possible, either on chip (wherever possible) or in the package. The φ1 and φ3 electrodes can be common between groups as these do not affect the gain. Separate connection could then be made for the φHV and φDC of each group. However this may not be necessary as only one of these is required to control the gain. Preferably, therefore, either the φHV connections can be common between each group and the gain is controlled by independently adjusting the φDC level of each group or alternatively, the φDC can be common between each group and separate connections to φHV can be made.

The voltage difference φ2−φDC is usually equal to 40 v and may be reduced selectively such that the gain provided by chosen elements, or groups of elements, is reduced to unity.

Ideally the gain of the subset of elements should be set to unity for the gain measurement to be performed. However, the invention would work if, for example, the gain on the subset is changed by changing applied clock level to φHV or dc level to φDC by a known amount, e.g. by 1 Volt. This may be less accurate than using unity gain a calculation would need to be done based on the shape of the gain curves (i.e. FIG. 4). This is possible as the shape remains reasonably constant with temperature and from device to device but the curves' position shifts along the abscissa. The shift in the curve does not affect the gain measurement.

As shown by the equations above, it is important that the input signal $S_{in}$ is kept constant while the measurements of first and second signal (with and without gain applied to selected elements) are conducted. A simple way of achieving this, when implemented in a camera is for the camera to view a constant scene. The average signal for a whole frame could be taken and then for another frame with the gain of a portion of the register reduced. This provides two average signals from which the gain can be calculated as explained above.

An alternative way of obtaining two signals for a frame array imager is to apply full gain (all elements used) and partial gain (some elements set to unity gain) alternately for each line read from the frame. On average, the signals from adjacent lines of an image are likely to be similar. When averaged across a whole frame, this effectively provides a constant average $S_{in}$ input signal. To which full or partial gain is applied. The gain is then determined as a ratio of the two signals as already described.

Figure 7:
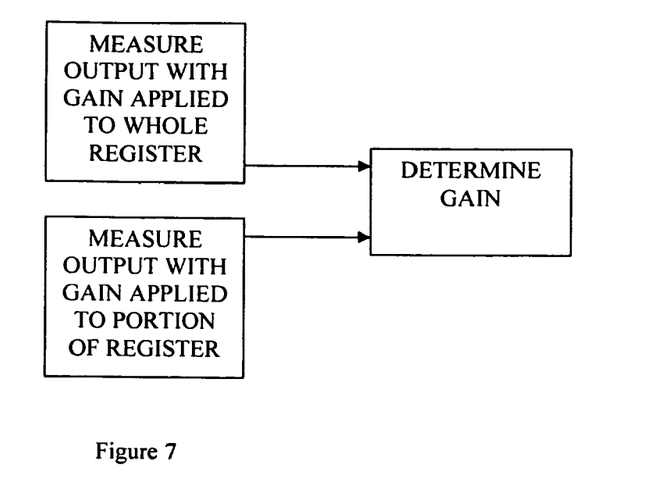
FIG. 7 is a flow diagram of the process to determine gain using the invention.

The method of operating a CCD device embodying the invention to determine the gain provided is shown in FIG. 7. In a first step an output signal for a line or frame is measured with gain applied to all elements of the multiplication register. In a second step, an output signal for the line or frame is measured with gain applied to a portion of the elements of the register. Then, the gain of the register is determined by the ratio of the two signals.

Figure 8:
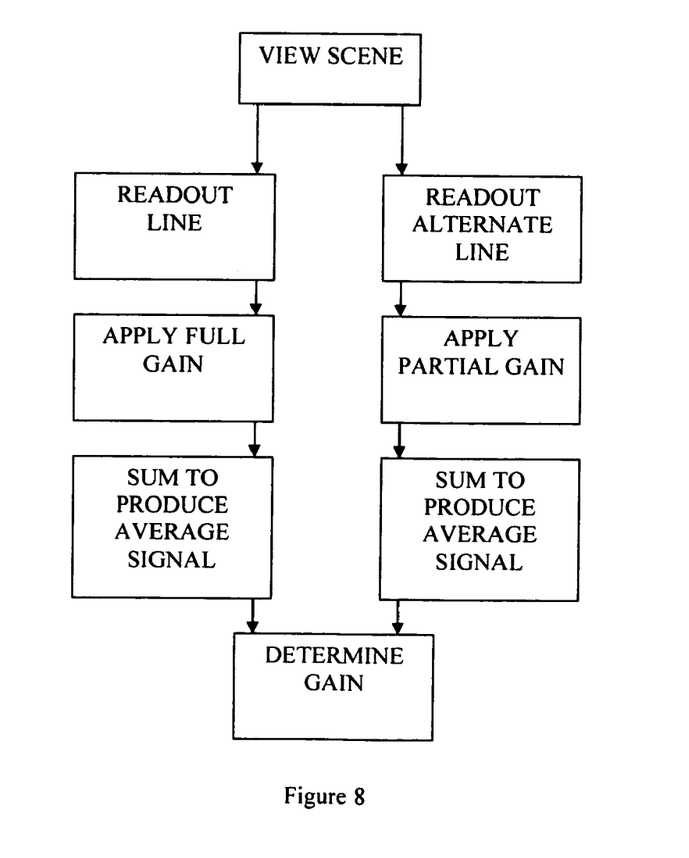
FIG. 8 is a flow diagram of the process to determine gain using alternate lines using the invention.

FIG. 8 shows the process by which alternate lines of an image may be used to measure gain. In a first step an output signal for a line is measured with gain applied to all elements of the multiplication register. In a second step, an output signal for the next line is measured with gain applied to a portion of the elements of the register. This process continues until all lines of an image have been read. Then, the signals produced from odd lines are summed to produce a first signal and the signals produced from the even lines summed to produce a second signal. The gain of the register is determined by the ratio of the two signals.

The invention claimed is:

1. A CCD device of the type for providing charge gain by impact ionisation, comprising:
   a multiplication register for producing charge gain having a plurality of elements, the gain provided by a subset of the plurality of elements independently controllable from the remainder of the elements of the multiplication register; and
   an output arranged to produce a first signal derived from the multiplication register with the same gain applied to all the elements and a second signal derived from the multiplication register with the elements of the subset of elements controlled to provide a different gain from a gain provided by the elements of the remainder of the elements, whereby the gain of the multiplication register is derivable from the first and second signals.

2. A CCD device according to claim 1, wherein the elements of the subset of elements are arranged sequentially with the remainder of the elements.

3. A CCD device according to claim 1, wherein the elements of the subset of elements are arranged interleaved with the remainder of the elements.

4. A CCD device according to claim 1, wherein each element comprises a sequence of electrodes including a high voltage electrode, the high voltage electrodes of the elements in the subset being connected together but not being connected to the remainder of the elements.

5. A CCD device according to claim 1, wherein each element comprises a sequence of electrodes including a DC electrode, the DC electrodes of the elements in the subset being connected together but not being connected to the remainder of the elements.

6. A CCD device according to claim 1, wherein the second signal is derived from the multiplication register with the subset of elements controlled to provide a substantially unity gain.

7. A CCD device according to claim 1, further comprising an array of light sensitive CCD elements arranged to provide charge to the multiplication register.

8. A CCD device according to claim 7, wherein the output is arranged to produce the first and second signals from charge derived from first and second respective captured images.

9. A CCD device according to claim 7, wherein the output is arranged to produce the first and second signals from charge derived from alternate respective lines within a captured image.

10. A method for deriving the normal gain provided by a multiplication register having a plurality of elements, comprising:
    deriving a first signal from the multiplication register with the normal gain applied to all the elements;
    deriving a second signal from the multiplication register with the elements of a subset of elements independently controlled from the remainder of the elements to provide a different gain from a gain provided by the elements of the remainder of the elements; and determining the normal gain of the multiplication register from the first and second signals.

11. A method according to claim 10, wherein the second signal is derived from the multiplication register with the subset of elements controlled to provide a substantially unity gain.

12. A method according to claim 10, wherein the first and second signals are derived from charge derived from first and second respective captured images.

13. A method according to claim 10, wherein the first and second signals are derived from charge derived from alternate respective lines within a captured image.

14. A method according to claim 10, wherein the elements of the subset of elements are controlled to provide a different gain from the gain provided by the remainder of the elements by altering the potential of the clock high level applied to the high voltage electrode within each element.

15. A method according to claim 10, wherein the elements of the subset of elements are controlled to provide a different gain from the gain provided by the remainder of the elements by altering the voltage applied to a DC electrode within each element.

16. A method according to claim 10, wherein the elements of the subset of elements are controlled to provide a different gain from the gain provided by the remainder of the elements by altering the phase relationship between the clock waveform applied to the high voltage electrode within each element and the other clock waveforms.

17. A CCD imaging device comprising an area array of light sensitive elements and a CCD device according to claim 10.

18. A camera including a CCD device according to claim 10.

19. The method according to claim 10, wherein deriving the second signal comprises:
    controlling the elements of the subset of elements to each provide the different gain, the different gain being different from the normal gain provided by each of the elements of the remainder of the elements.

20. The method according to claim 10, wherein determining the normal gain of the multiplication register from the first and second signals comprises:
    deriving the normal gain of the multiplication register based on the fractional change in signal between the first and second signal relative to the number of elements in the subset of elements.

21. The CCD device according to claim 1, further comprising:
    an image area for collecting charge; and
    an output register coupled to the image area to receive the collected charge,
    wherein the multiplication register is serially connected to the output register to receive the collected charge.

* * * * *